United States Patent [19]

Ruddle et al.

[11] 4,415,405

[45] Nov. 15, 1983

[54] METHOD FOR ENGRAVING A GRID PATTERN ON MICROSCOPE SLIDES AND SLIPS

[75] Inventors: Frank H. Ruddle, New Haven; Pin-Fang Lin, Branford, both of Conn.

[73] Assignee: Yale University, New Haven, Conn.

[21] Appl. No.: 294,153

[22] Filed: Aug. 19, 1981

[51] Int. Cl.³ .................... B44C 1/22; C03C 15/00; C03C 25/06

[52] U.S. Cl. .................... 156/645; 156/659.1; 156/663; 252/79.3; 356/244; 430/321; 430/323

[58] Field of Search ............ 156/645, 654, 658, 659.1, 156/663; 252/79.3; 430/320, 321, 323, 329, 330; 350/92, 94, 95

[56] References Cited

U.S. PATENT DOCUMENTS 2,162,590  6/1939  Richter et al. .................. 156/645 X
2,659,665  11/1953 Parsons et al. .................. 156/663 X
3,054,709  9/1962  Freestone et al. .................. 156/645

OTHER PUBLICATIONS

National Bureau of Standards Circular 565, Aug. 26, 1955, Techniques for Ruling and Etching Precise Scales in Glass and their Reproduction by Photoetching with a New Light-Sensitive Resist by Raymond Davis et al., pp. 1-36.

Primary Examiner—William A. Powell
Attorney, Agent, or Firm—Kenyon & Kenyon

[57] ABSTRACT

A method for engraving a grid pattern on a slide or slip is described which employs a photographic technique to create a grid pattern image in a photoresist coating on the slide or slip. Development and etching produce the engraved slide or slip. They are useful for accurate and repeated identification of cultured or manipulated cells growing thereon.

12 Claims, 4 Drawing Figures

METHOD FOR ENGRAVING A GRID PATTERN ON MICROSCOPE SLIDES AND SLIPS

BACKGROUND OF THE INVENTION

This invention relates to a method for etching an identification grid pattern onto a microscope slide or cover slip.

The intense current interest in cellular manipulation, gene splicing techniques and cellular microinjection has accentuated the need to keep track of the treated cells. Typically, such cells are manipulated with the aid of a microscope, and portions of slide or cover slip holding the cells are marked out for microscopic location of the cells.

There are several recently-developed methods for performing this task. One uses an objective lens scriber to mark cover slips, and the cells within the scribed circle can be manipulated. [Diacumakos, "Methods in Cell Biology", D. M. Prescott, ed., Vol. 7, p. 287, Academic Press, New York, 1973.] In another, radiolabeled or fluorescent markers are added to the sample. [Stacey, Methods in Enzymology, in press (1981).] In a third, wax-coated slides are scored and numbered with a steel needle, then etched with a paste made from calcium fluoride and hydrofluoric acid. [Graessmann A., Graessman, M. & Mueller C., Methods enzymology 65 816 (1980)]

These methods, however, suffer from irregularities in marking, do not permit the marking of very small areas, and are difficult and time-consuming to perform. Therefore, it is an object of the invention to develop a method for marking out small repetitive areas on microscope slides and cover slips. A further object is to be able to perform the method easily and quickly.

SUMMARY OF THE INVENTION

These and other objects are achieved by the present invention which is directed to a method for photographically engraving microscope slides and cover slips. According to this method, positive or negative photoresist material is applied to a glass surface of the slip or slide to produce a substantially uniform photosensitive coating thereon. The coating is then exposed to light transmitted through an appropriately designed photographic transparency of the desired grid pattern. The transparency is selected to correspond to the type of photoresist used; a negative transparency is used with positive photoresist and a positive transparency is used with negative photoresist. Exposure causes a photochemical reaction to occur in the coating at positions contacted by the light. The coating is then developed using an appropriate reagent solution which removes the portions of photoresist replicating the grid pattern. A replica of the image of the grid pattern is thus produced in the coating, the lines of which constitute the removed portions of the coating. The exposed portions of the glass surface underneath the lines are then etched with a silicate glass etchant composition to form the engraved grid pattern in the glass. Removal of the remaining coating then completes the preparation.

The present invention also includes an engraved microscope slide or cover slip produced by the method of the invention.

BRIEF DESCRIPTION OF THE DRAWINGS

The drawings depict several aspects and embodiments of the invention.

DETAILED DESCRIPTION OF THE INVENTION

Figure 1:
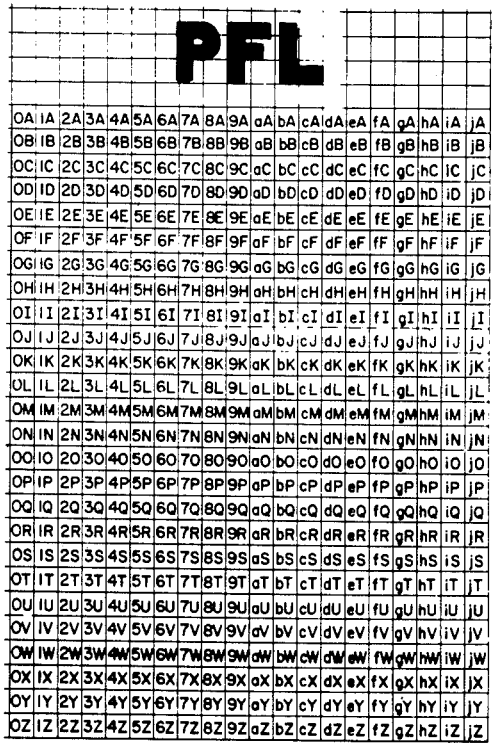
FIG. 1 shows a typical grid pattern in positive image form which would be present on a positive photographic transparency.

The engraving of microscope slips or slides according to the present invention will readily produce uniform, closely-spaced, well-defined, marked out areas in the glass. In general, the technique is related to photolithography and semiconductor fabrication techniques used to make integrated circuits. Some of the processes are photographic in nature in that they involve a photochemically induced reaction in a solid medium to cause differential changes on the surface of the solid medium.

The steps of the engraving process, generally, are: generation of a photographic transparency or photomask of the desired grid pattern; coating the glass with photoresist, forming a light image of the photomask on the coating, development of the coating, etching the glass and removing the remaining coating. The process is conducted under photographically safe conditions such as use of a "safe" light or no light during coating, exposure and development.

The method may be utilized in batch or continuous processes to prepare simultaneously or continuously a plurality of slips or slides. In the batch process, a large glass sheet which has been prescored to mark out the individual slips or slides is substituted for the individual slip or slide in the foregoing process. The photographic transparency is appropriately sized and imaged for the plurality of slips or slides that are to be simultaneously exposed. An automated transparency aligner may be used to perform this task.

In the continuous process, an endless glass strip is manufactured from a molten glass source, prescored and continuously coated, exposed, developed and etched according to the foregoing description. The coating operation is adjusted so that each marked out slip or slide is completely coated. The photographic transparency is appropriately sized and imaged with an appropriate number of grid patterns for exposure of the portion of the strip that is moving through the exposure cycle. An automated transparency aligner may be used to perform this task.

At the completion of the batch or continuous process, the glass is broken along the score lines to produce individual slips or slides or small multiples thereof. Typical, well-known glass treatment processes such as polishing, annealing, shaping and blowing may also be performed before or after the engraving process of the invention.

The glass coated with photoresist material and the photographic transparency form a photographic system for image reproduction. In this system, the photoresist is a photosensitive organic composition which undergoes chemical transformation upon exposure to light. The image on the transparency is reproduced in the photoresist coating.

The coating may be of a positive or negative type. The corresponding photographic transparency of the grid pattern must be appropriately selected so that the photoresist material underneath the grid pattern lines will be removed during development.

Negative types such as Kodak "KPR", "KTFR" and gelatinchromate polymerize upon exposure and the exposed portions are not removed by the developing solution. Positive types such as Shipley "AX350" and "AX1370" become soluble in developing solution after they are exposed to light and exposed portions are removed. Since the material marked by the grid pattern lines is to be removed when using either type of photoresist, the proper transparency must be chosen. For negative photoresist, light should not be transmitted through the grid pattern lines; therefore, a positive transparency is appropriate. For positive photoresist, light should be transmitted through the grid pattern lines but not through other parts of the transparency; therefore, a negative transparency is appropriate. Development with an appropriate developer solution, which dissolves the photolyzed photoresist, fixes the grid pattern image in the coating and removes unwanted photoresist. A preferred system is positive photoresist and the corresponding negative transparency.

The coating may be applied using methods known to those skilled in the art which will yield a smooth completely covered glass surface. The coating should have no ridges, bumps or other major imperfections therein which could adversely affect the photographic exposure and photochemical reaction. Typically, a coating of this type will be substantially uniform in nature and the application process may include shaking, spinning or agitation of the glass or other method which will distribute the coating over the glass surface. In a preferred form, the coating is from about 0.5 to 10 microns thick with a few (1–4) microns being preferred.

In a preferred embodiment of the process, the photoresist coating is baked before its exposure to light and/or after its development. These additional steps create a stronger adherence of the coating to the glass, increase photosensitivity, increase resistivity to the etchant composition and harden the coating. The times and temperatures are adjusted in a manner that favorably affects these features. Such adjustment and manipulation are easily performed by those skilled in the art. Typically temperatures of from about 50° C. to about 150° C. and times of about 10 to about 120 minutes will be employed.

The light exposure intensity and time for coating photolysis will generally follow the requirements provided by the photoresist manufacturer. With the transparency attached directly to the coated glass, intensities on the order of 1 to $100 \times 10^{-2}$ watts per cm$^2$, and times from 1 to 30 minutes will typically be useful when positive photoresist is employed. The transparency may also be used in conjunction with the light projector. With this procedure, the grid image is focused upon the coating and it may be given an enlarged or reduced size.

Useful developers are known to those skilled in the art. Typically, these include such solvents as Kodak developer or Shipley AZ351. Subsequently, etching takes place selectively in those regions of the coating where the photoresist has been removed by development.

Procedures for etching the glass are well known in the art. Times, temperatures, etching compositions and application techniques are readily available in standard texts on the subject. Care will be taken to expose only the coated glass surface to the etching composition. Typically, from about 1 to 5 weight percent hydrofluoric acid solution will usefully etch the glass at temperatures from ambient to about 40° C. within a period of about 1 to 30 minutes. Rinsing with water or other similar solvent, in which the etchant is soluble, is appropriate and will stop the etching process.

Although the etchant composition may be any of those known to etch silicate glass while being unable to attack readily photoresist material, typically, fluoride compounds are employed. It is preferred to use aqueous hydrofluoric acid having a concentration of up to about 5 weight percent or an ammonium fluoride solution of a concentration up to about 50 weight percent or a mixture thereof with the hydrofluoric acid having a fluoride to acid ratio of from about 5:1 to about 15:1. A ratio of about 10:1 is especially preferred.

This method permits the engraving of grids of very small dimensions, and each grid can be easily numbered by this technique so that the localization of individual cells under the microscope is facilitated. In addition to being simple and efficient, the method also lends itself readily to mass production by batch or continuous techniques.

Engraved slides and slips produced by the foregoing process have successfully been used to grow both primary and established human and rodent cells. Such cells have also been microinjected and autoradiographically tested for the expression of injected material while positioned on the engraved slide or slip. The grid pattern on the slide or slip can be easily read even after it is coated with an emulsion for microphotography of cells. Moreover, the photoengraved slips or slides can be used with chromosome preparations in order to record the positions of individual metaphase spreads. The method obviates the use of a stage micrometer, and slides or slips can be transferred from one microscope to another without the necessity of recalibration.

The following example more particularly illustrates some of the features of the invention set forth by the foregoing description.

Example of Photoengraving Using Positive Photoresist

Figure 4:
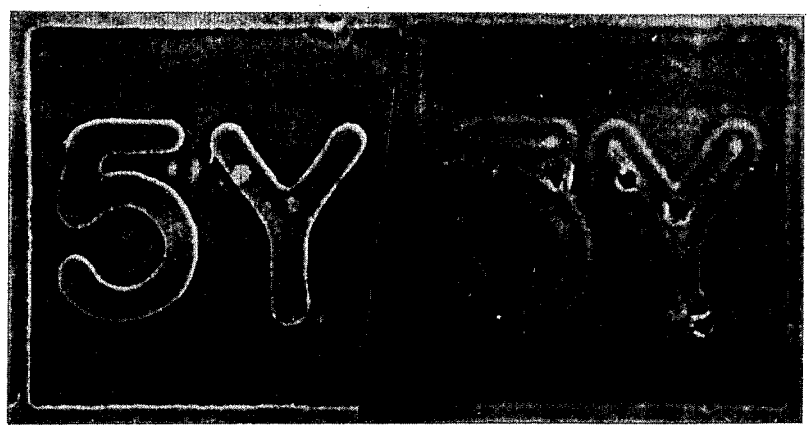
FIG. 4 shows an enlargement of a marked portion of a microscope slide engraved with the grid pattern shown in FIG. 1, on which has been cultured murine LMTK− cells.

The production of the photomask is described in step 1. The photoreproduction and engraving process used to transfer the grid pattern onto the microscope slide are described in steps 2–6. An enlarged portion of this slide having cultured cells growing thereon is shown in FIG. 4.

Step 1. Mask Production

Figure 2:
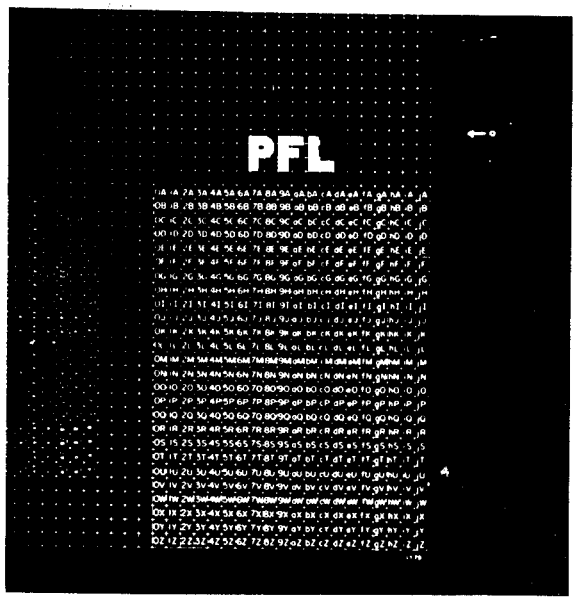
FIG. 2 shows a portion of a negative photographic transparency having the negative grid pattern image.

A reduced copy of an original grid pattern is shown in FIG. 1. The letters PFL above the grid are used to facilitate slide orientation. The mask shown in FIG. 2 (2×magnification of the working mask) is the negative image of the further reduced grid pattern. The final dimension of each grid square is 0.56 mm. The mask was taped onto a first glass plate (6×6 cm), (b) of FIG. 3, for ease of handling during subsequent steps.

The following steps were performed under a yellow safe light.

Step 2. Photoresist Coating

A slide was uniformly coated approximately to a one micron thickness with positive photoresist (Shipley Manufacturing, AZ1370). This was done by putting a few drops of photoresist on the slide, followed by spinning on a photoresist spinner at 3000 rpm for one minute. Agitation by a vibrator may also be employed.

Step 3. Pre-exposure Baking and Exposure

Figure 3:
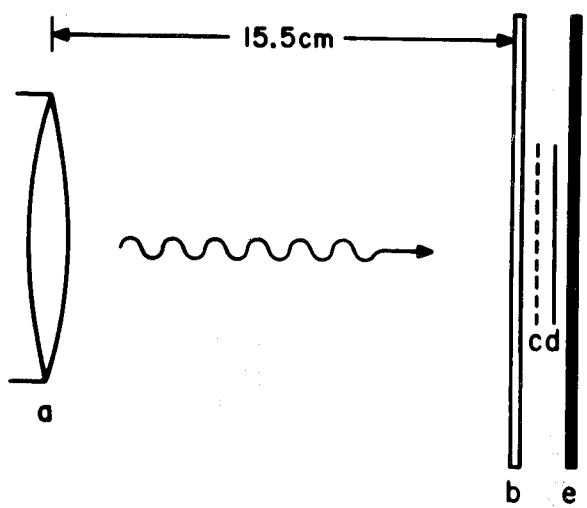
FIG. 3 shows one type of arrangement for photoresist coating exposure.

The coated slide was baked at 90° C. for 15 minutes to harden the photoresist. Then the slide was sandwiched between the mask and a black backing slide, with the coated side of the slide facing the mask. The glass plate (b), the mask (c), the slide (d) to be engraved, and the black backing slide (e) were held together by two clamps, and placed at a distance of 15.5 cm in front of a "Leitz" slide projector (a), as shown in FIG. 3. The exposure time was two minutes for an incident light intensity of $3 \times 10^{-2}$ watt/cm$^2$. The purpose of the black backing slide was to prevent exposure to stray and reflected light.

Step 4. Developing

The exposed slide was developed in diluted Shipley Manufacturing AZ-351 developer (1 to 5 dilution in deionized H$_2$O) for 40 seconds, and then rinsed in deionized H$_2$O for 1 minute. The grid pattern appeared in the developed photoresist image.

Step 5. Post-development Baking and Etching

After baking at 90° C. for 20 minutes, the slide was subsequently etched in 2.4% HF/H$_2$O for 10 minutes and rinsed in deionized H$_2$O for 1 minute. The pattern became engraved onto the slide.

Step 6. Photoresist Stripping and Cleaning

The clean engraved slide was obtained when the remaining photoresist was washed away with acetone. This step required about 1 minute, when using an ultrasonic bath.

The grid on an etched slide is shown in FIG. 4A at 125x magnification. The area shown corresponds to the numbered region in FIG. 1. FIG. 4B shows that when cells are brought to focus under the microscope, the grid pattern is still visible in the background. The small grid size and the identification number within each grid, facilitates the localization of individual micromanipulated cells or chromosome spreads on a microscope.

We claim:

1. A method for engraving a closely-spaced grid pattern onto a glass microscope slide or cover slip, which comprises:

applying a positive photoresist to a glass surface of the slide or slip to produce a substantially uniform, dry, positive photoresist coating thereon;

baking the coated slide at a temperature of from about 50° C. to about 150° C. for about 10 to 120 minutes, to produce a slide with a baked coating;

exposing the baked coating to light transmitted through a photographic transparency of the grid pattern to produce a photochemical reaction in the exposed portions of the coating;

removing the exposed portion of the coating with positive photoresist developer to produce a coated slide with a replicated image of the grid pattern in the coating;

rebaking the coated slide with the grid pattern image in the coating at a temperature of from about 50° C. to about 150° C. for about 10 to 120 minutes to produce a rebaked slide;

etching the portions of the glass surface of the slide which are exposed by the grid pattern in the coating thereon, with aqueous hydrofluoric acid, aqueous ammonium fluoride or a mixture thereof, to form an engraved grid pattern in the glass; and removing the remaining coating from the glass slide.

2. A method according to claim 1 wherein the etchant is aqueous hydrofluoric acid having a concentration of up to about 5 weight percent or aqueous ammonium fluoride in hydrofluoric acid having a fluoride to acid ratio of from about 5:1 to about 15:1 and a hydrofluoric acid concentration of up to about 5 weight percent.

3. A method according to claim 1, which further comprises:

etching simultaneously a plurality of slips or slides by applying a substantially uniform coating of photoresist to a large glass sheet prescored to mark out a plurality of slips or slides and employing a grid pattern transparency corresponding to the plurality of slips or slides.

4. A method according to claim 3, which further comprises:

breaking the sheet along the score lines to produce individual slips or slides.

5. A method according to claim 1, which further comprises:

forming a continuous strip of slide or slip glass;

continuously prescoring the strip to mark out each slip or slide;

continuously applying a substantially uniform photoresist coating to the strip in a manner so that each marked out slip or slide is completely coated;

continuously exposing and developing the coating on each marked out slide or slip or plurality thereof;

continuously etching the glass surface having the developed coating thereon; and continuously removing the coating.

6. A method according to claim 5, which further comprises:

breaking the glass strip along the score lines to produce individual slips or slides.

7. A method according to claim 1, 3 or 5 wherein the grid pattern is numbered or lettered.

8. A method according to claim 1, 3 or 5 wherein the photoresist coating is from about 0.5 to 10 microns thick.

9. A method according to claim 1, 3 or 5 wherein the slip, slide, sheet or strip is shaken, spun or agitated after application of the photoresist coating.

10. A method according to claim 1, 3 or 5 wherein the uncoated glass surface contacts a black backing surface during exposure of the coating.

11. A method according to claim 1, 3 or 5 wherein the grip pattern comprises intersecting lines which enclose areas having dimensions of a minimum of about 1 micron.

12. A method according to claim 1, 3 or 5 wherein positive photoresist and a photographic negative transparency are used.

* * * * *

UNITED STATES PATENT AND TRADEMARK OFFICE
CERTIFICATE OF CORRECTION

PATENT NO. : 4,415,405
DATED : November 15, 1983
INVENTOR(S) : Ruddle, Frank H. & Lin, Pin-Fang It is certified that error appears in the above—identified patent and that said Letters Patent is hereby corrected as shown below:

Column 1, line 4, before "Background of the Invention", please insert:

-- The government has rights in this invention pursuant to Grant No. 5-R01 AGO 1940-02 awarded by the Department of Health and Human Services. --

Signed and Sealed this

Twentieth Day of March 1984

[SEAL]

Attest:

Attesting Officer

GERALD J. MOSSINGHOFF
Commissioner of Patents and Trademarks